(12) United States Patent
Cawthorne et al.

(10) Patent No.: US 7,649,378 B1
(45) Date of Patent: Jan. 19, 2010

(54) METHODS FOR EVALUATING PERMANENT MAGNET MOTORS AFTER MANUFACTURE AND DURING SERVICE

(75) Inventors: William R. Cawthorne, Milford, MI (US); Sean E. Gleason, West Bloomfield, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 0 days.

(21) Appl. No.: 12/197,832

(22) Filed: Aug. 25, 2008

(51) Int. Cl.
*G01R 31/34* (2006.01)
(52) U.S. Cl. .................. 324/772; 318/15; 318/118
(58) Field of Classification Search ............ None
See application file for complete search history.

(56) References Cited

U.S. PATENT DOCUMENTS 7,122,980 B2 * 10/2006 Kuroshima et al. ..... 318/400.11
7,365,506 B2 * 4/2008 Yamamoto et al. .......... 318/432

\* cited by examiner

*Primary Examiner*—Minh N Tang
(74) *Attorney, Agent, or Firm*—Ingrassia Fisher & Lorenz, P.C.

(57) ABSTRACT

A method evaluates a motor assembly having a first permanent magnet motor in a transmission of an automotive drive system at an end of manufacturing line evaluation. The first motor includes a first rotor with a first plurality of magnets mounted thereon, and a first stator with a first plurality of windings in proximity to the first rotor and coupled to a first inverter. The method includes spinning the first motor with an input dynamometer machine to a predetermined speed such that the first rotor of the first motor induces a first voltage on the first inverter; measuring the first voltage on the first inverter; calculating a first voltage constant of the first motor from the first voltage; comparing the first voltage constant to accepted voltage constants; and identifying the motor as not acceptable if the first voltage constant is outside of a range of the accepted voltage constants.

20 Claims, 3 Drawing Sheets

METHODS FOR EVALUATING PERMANENT MAGNET MOTORS AFTER MANUFACTURE AND DURING SERVICE

TECHNICAL FIELD

The present invention generally relates permanent magnet motors, and more particularly relates to methods for evaluating permanent magnet motors.

BACKGROUND

Hybrid vehicle systems typically utilize one or more electric, permanent magnet motors as part of a transmission system that provides a propulsion source to compliment the engine. The accuracy of the manufacture, service, and operation of these motors to produce specified torque profiles is important to the consistent and efficient operation of the vehicle.

Various issues can arise in the manufacture, assembly, transport, service, and use of the motors that can affect the performance. For example, the magnet flux strength of the motors can be diminished due to factors such as the particular characteristics of the magnets, including field strength and effects of heat and vibration. Similarly, if the stators of the motors are not properly wound with the specified number of turns per coil, performance can be affected. Another factor that contributes to the performance of the motors is the material utilized to fabricate the stators of the motors. Typically, steel or a similar material forms part of the magnetic circuit through with the magnet flux of the motor flows. As an example, the magnetic permeability of the steel can vary with the types of material used to manufacture the motors, and this variation can impact the performance of the motor.

One mechanism of evaluating a motor involves the calculation and evaluation of a voltage constant, which is a function of the number of windings of the stator, the permeability of the flux path, and the field strength of the rotor magnets. Conventional methods calculate the voltage constant of the motor based on voltage measurements from the motor itself. However, these methods are typically unavailable when the motor is installed in the transmission.

Accordingly, it is desirable to provide methods for evaluating permanent magnet motors in transmissions in a variety of situations, such as after manufacturing or during service of the vehicle. In addition, it is desirable to provide such methods in an economical and convenient manner. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with an exemplary embodiment, a method is provided for evaluating a motor assembly having a first permanent magnet motor in a transmission of an automotive drive system at an end of manufacturing line evaluation. The first motor includes a first rotor with a first plurality of magnets mounted thereon, and a first stator with a first plurality of windings in proximity to the first rotor and coupled to a first inverter. The method includes spinning the first motor with an input dynamometer machine to a predetermined speed such that the first rotor of the first motor induces a first voltage on the first inverter; measuring the first voltage on the first inverter; calculating a first voltage constant of the first motor from the first voltage; comparing the first voltage constant to a set of accepted voltage constants; and identifying the motor as not acceptable if the first voltage constant is outside of a range of the accepted voltage constants.

In accordance with another exemplary embodiment, a method is provided for evaluating permanent magnet motors in a transmission of an automotive drive system in a service environment. The motors include first and second motors, each including a rotor with a plurality of magnets mounted thereon, and a stator with a plurality of windings in proximity to the rotor, with the windings of the first and second motor are respectively coupled to first and second inverters. The method includes spinning the first motor to a predetermined speed to spin the second motor such that the rotor of the second motor induces a voltage on the second inverter; measuring the voltage on the second inverter; calculating a voltage constant of the second motor from the voltage; and comparing the voltage constant of the second motor to a set of accepted voltage constants.

In accordance with yet another exemplary embodiment, an automotive drive system includes an internal combustion engine; and a two-mode, compound-split, electro-mechanical transmission coupled to the internal combustion engine. The transmission includes an input member to receive power from the internal combustion engine; an output member to deliver power from the transmission; the first motor and a second motor that are coaxially aligned; first, second, and third coaxially aligned planetary gear arrangements, each planetary gear arrangement utilizing first, second and third gear members, the first and second motors being coaxially aligned with the three planetary gear arrangements, at least one of the first, second, and third gear members in the first or second planetary gear arrangement being connected to the first motor, and another one of the first, second, and third gear members in the second and third planetary gear arrangements being connected to the second motor, one of the gear members of the first planetary gear arrangement being continuously connected to the input member; a first clutch to selectively connect one of the gear members of the third planetary gear set with ground; a second clutch to selectively connect one of the gear members associated with each of the planetary gear arrangements to each other and to the output member; a third clutch to selectively connect one of the gear members of the second planetary gear set with another of the gear members of the second planetary gear set; a fourth clutch to selectively connect one of the gear members of the second planetary gear set with ground; a first interconnecting member continuously connecting one of the members of the first planetary gear set with one of the members of the second planetary gear set; and a second interconnecting member continuously connecting one of the members of the second planetary gear set with one of the members of the third planetary gear set. The system further includes a power inverter coupled to the first and second motors; and a processor configured to measure a first voltage induced by the first motor at the power inverter when the first motor is spun to a predetermined speed; calculate a first voltage constant from the first voltage; compare the first voltage constant to a set of accepted voltage constants; measure a second voltage induced by the second motor at the second inverter when the second motor is spun to the predetermined speed; calculate a second voltage constant of the second motor from the second voltage; and compare the second voltage constant to a set of accepted voltage constants.

DESCRIPTION OF THE DRAWINGS

The present invention will hereinafter be described in conjunction with the following drawing figures, wherein like numerals denote like elements, and wherein.

DESCRIPTION OF AN EXEMPLARY EMBODIMENT

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Exemplary embodiments described herein provide a method for evaluating permanent magnet motors within a two-mode, hybrid, compound-split, electromechanical transmission. Evaluation methods are particularly provided after manufacturing or during service of the transmission by calculating a voltage constant based on voltage measurements taken at the inverter coupled to the motors and comparing the voltage constant to predetermined values. If the calculated voltage constant is within an acceptable threshold range from the predetermined values, then it can be determined that the motors were properly manufactured, installed, and/or maintained.

In the description below, the structural and functional components of the transmission and motors are first described, including an explanation of the relationship between the voltages generated by the motor within the transmission and the voltages measured at the inverters. The conditions and methods for evaluating the motors will then be provided in further detail.

Figure 1:
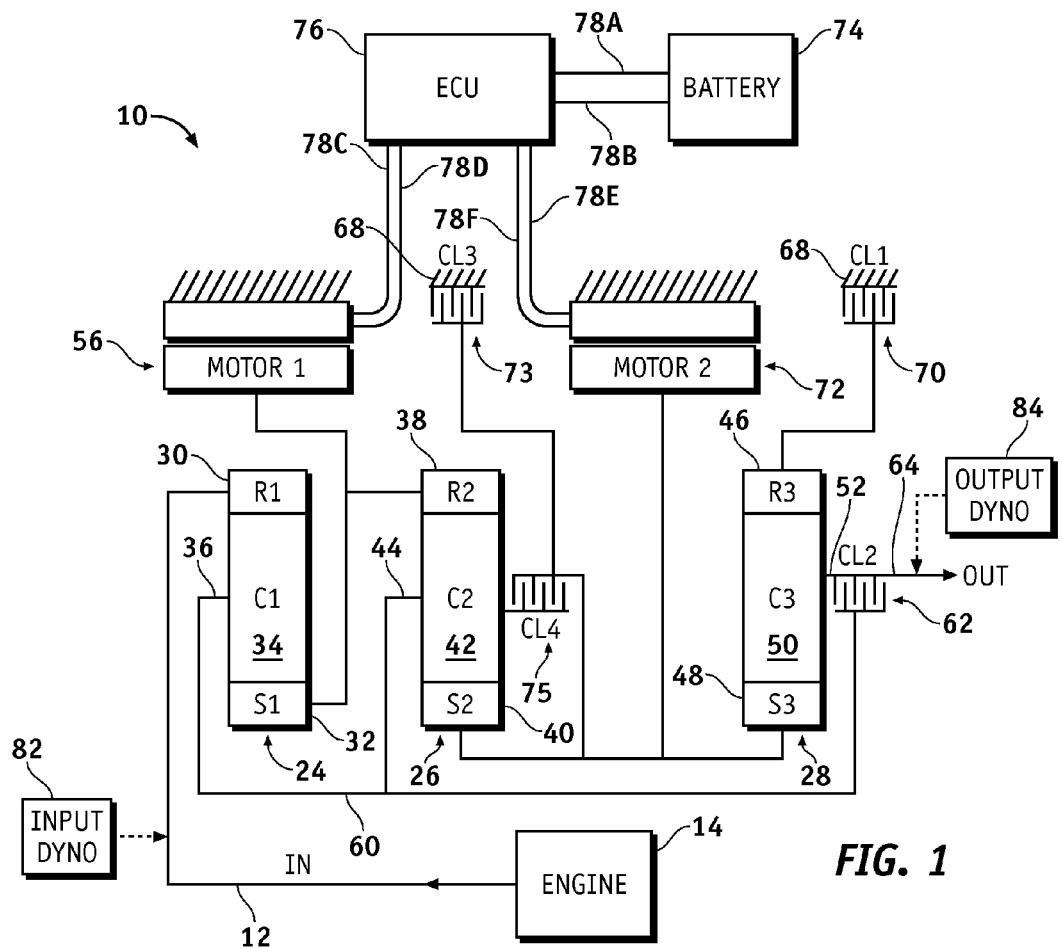
FIG. 1 is a block diagram of a two-mode, hybrid, compound-split, electromechanical transmission in accordance with an exemplary embodiment.

In accordance with an exemplary embodiment, a two-mode, hybrid, compound-split, electromechanical transmission 10 is depicted in FIG. 1. The hybrid transmission 10 has an input member 12, such as a shaft, that may be directly driven by an engine 14. A transient torque damper (not shown) may be incorporated between the engine 14 and the input member 12 of the transmission 10.

The engine 14 may be a fossil fuel engine, such as a diesel engine. In the exemplary embodiment, the engine 14, after start-up, and during the majority of its input, operates at a range of speeds from approximately 600 to approximately 6000 RPM. Although the particular speed and horsepower output of the engine 14 can vary, for the purpose of effecting a clear understanding of the hybrid transmission 10, an available output of about 300 horsepower from engine 14 will be assumed for the description of an exemplary installation.

The transmission 10 includes three planetary gear sets 24, 26 and 28. The first planetary gear set 24 is connected to the input member 12 and has a ring (or "outer") gear member 30 that circumscribes a sun (or "inner") gear member 32. Any number of planet gear members 34 are rotatably mounted on a carrier 36 such that each planet gear member 34 can rotate and mesh with both the outer gear member 30 and the sun gear member 32.

The second planetary gear set 26 also has a ring gear member 38 circumscribing a sun gear member 40. A number of planet gear members 42 are rotatably mounted on a carrier 44 such that each planet gear 42 engages both the ring gear member 38 and the sun gear member 40.

The third planetary gear set 28 also has a ring gear member 46 circumscribing a sun gear member 48. A number of planet gear members 50 are rotatably mounted on a carrier 52 such that each planet gear 50 engages both the ring gear member 46 and the sun gear member 48.

The first and second planetary gear sets 24 and 26 are compounded in that the sun gear member 32 of the first planetary gear set 24 is conjoined, as through a hub plate gear (or first interconnecting member) 54, to the ring gear member 38 of the second planetary gear set 26. The conjoined sun gear member 32 of the first planetary gear set 24 and the ring gear member 38 of the second planetary gear set 26 are continuously coupled to a first motor 56. As used herein, the term "motor" can include a generator. The first motor 56 is described in further detail below.

The first and second planetary gear sets 24 and 26 are further compounded in that the carrier 36 of the first planetary gear set 24 is conjoined, as through a shaft 60, to the carrier 44 of the second planetary gear set 26. As such, carriers 36 and 44 of the first and second planetary gear sets 24 and 26, respectively, are conjoined. The shaft 60 selectively connects to the carrier 52 of the third planetary gear set 28 through a clutch (or "second clutch" CL2) 62, which assists in the selection of the operational modes of the hybrid transmission 10. As used herein the term "clutch" refers to any device capable of transmitting rotation that can be engaged and disengaged, such as for example, a friction clutch, a multi-plate wet clutch, a magnetorheological (MR) fluid clutch, or a motor-generator clutch.

The carrier 52 of the third planetary gear set 28 is coupled directly to the transmission output member 64. When the hybrid transmission 10 is used in a land vehicle, the output member 64 may be connected to the vehicular axles (not shown) that may, in turn, terminate in the drive members (also not shown). The drive members may be either front or rear wheels of the vehicle on which they are employed, or they may be the drive gear of a track vehicle.

The ring gear member 46 of the third planetary gear set 28 selectively couples to ground, represented by the transmission housing 68, through a clutch (or "a first clutch" CL1) 70. The first clutch 70 also assists in the selection of the operational modes of the hybrid transmission 10, as will be described in further detail below. The sun gear 48 is continuously coupled to a second motor 72. All the planetary gear sets 24, 26 and 28 as well as the two motors 56 and 72 are shown coaxially oriented, as about the axially disposed shaft 60. Both motors 56 and 72 are shown in this embodiment as being of an annular configuration that permits them to circumscribe the three planetary gear sets 24, 26 and 28 such that the planetary gear sets 24, 26 and 28 are disposed radially inwardly of the motor 56 and 72. This configuration assures that the overall envelope, i.e., the circumferential dimension, of the transmission 10 is minimized.

Figure 2:
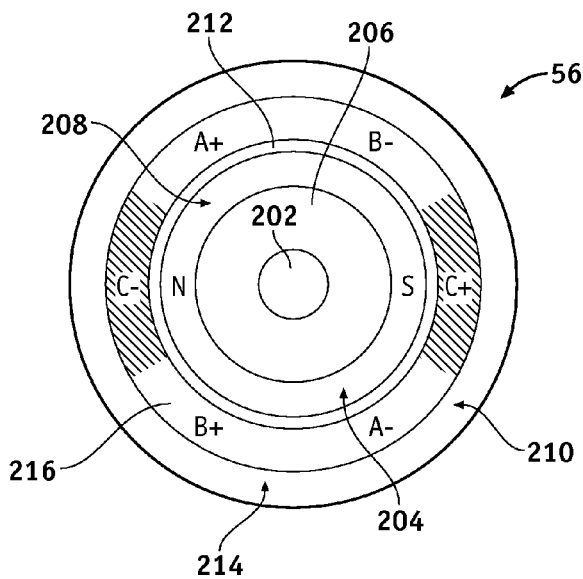
FIG. 2 is a cross-sectional representation of an exemplary electric motor.

A clutch (or "third clutch" CL3) 73 selectively couples the sun gear 40 with ground (i.e., with transmission housing 68). A clutch (or "fourth clutch" CL4) 75 is operative as a lock-up clutch, locking planetary gear sets 24, 26, motor 56, and the input 12 to rotate as a group, by selectively coupling the sun gear 40 with the carrier 44. The sun gear 40 is also coupled to the sun gear 48. Although one exemplary transmission arrangement is depicted in FIG. 2, the systems and methods disclosed herein can be provided for any gearing and clutch configuration.

The transmission 10 operates as a two-mode, compound-split, electro-mechanical, vehicular transmission. "Modes" of operation refer to circumstances in which the transmission functions are controlled by one clutch (e.g., clutch 62 or clutch 70), and the controlled speed and torque of the motor 56 and 72, one example of which is described in U.S. Pat. No. 5,009,301 which issued on Apr. 23, 1991 to General Motors Corporation. In one exemplary embodiment, a first mode is selected when the first clutch 70 is actuated in order to "ground" the ring gear member 46 of the third planetary gear set 28. A second mode is selected when the first clutch 70 is released and the second clutch 62 is simultaneously actuated to connect the shaft 60 to the carrier 52 of the third planetary gear set 128.

Additionally, certain "ranges" of operation may be achieved by applying an additional clutch (e.g., clutch 62, 73 or 75). When the additional clutch is applied (i.e., when two clutching mechanisms are applied), a fixed input to output speed ratio (i.e., a fixed gear ratio) is achieved. The rotations of the motors 56 and 72 will then be dependent on internal rotation of the mechanism as defined by the clutching and proportional to the input speed. In one embodiment, the first range falls within the first mode of operation when the first and fourth clutches 70 and 75 are engaged, and the second range falls within the first mode of operation when the first and second clutches 62 and 70 are engaged. A third fixed ratio range is available during the second mode of operation when the second and fourth clutches 62 and 75 are engaged, and a fourth fixed ratio range is available during the second mode of operation when the second and third clutches 62 and 73 are engaged.

The transmission 10 selectively receives power from the engine 14. The transmission 10 also receives power from an electric storage device 74. The electric storage device 74 may be one or more batteries or other types of storage devices. The electric storage device 74 communicates with an electrical control unit (ECU) 76 by transfer conductors 78A and 78B. The ECU 76 communicates with the first motor 56 by transfer conductors 78C and 78D, and the ECU 76 similarly communicates with the second motor 72 by transfer conductors 78E and 78F.

The ECU 76 obtains information from both the first and second motors 56 and 72, respectively, the engine 14 and the electric storage device 74. In response to an operator's action, or "operator demand" (e.g., from a drive range selector, an accelerator pedal, and/or a brake pedal), the ECU 76 determines what is required and then manipulates the selectively operated components of the hybrid transmission 10 appropriately to respond to the operator demand.

FIG. 2 illustrates a cross sectional view of the motor 56 utilized in the transmission 10 described above. The motor 56 is described to provide a greater understanding of the exemplary motor evaluation methods described below. The motor depicted in FIG. 2 is labeled as the first motor 56, although it could also represent the second motor 72.

The motor 56 can be a two pole, three phase, brushless permanent magnet machine, although the description below can be applicable to any number of poles. The motor 56 includes a shaft 202 for providing input to the motor 56 and receiving output from the motor 56. A rotor 204 is coupled to the shaft 202 and includes a rotor core 206 with permanent magnets 208 mounted thereon. A stator 210 is separated from the rotor 204 by an air gap 212 and includes a stator core 214 with armature windings 216 positioned thereon.

As the rotor 204 rotates with respect to the windings 214 on the stator 210, a voltage is induced in the windings 216 as specified by Faraday's Law, which is expressed as Equations (1) below.

$$e_{ind} = -\frac{d\lambda}{dt} \quad (1)$$

where $\lambda$ is the total flux linking the stator winding and $e_{ind}$ is the voltage induced on the coil.

Assuming the magnets 208 are evenly distributed around the rotor 204, the flux linkage can be written as Equation (2).

$$\lambda = K_v \sin(\omega t) \quad (2)$$

where $K_v$ is the voltage constant of the motor and $\omega$ is the rotational frequency of the motor.

The voltage constant $K_v$ is a function of various parameters of the motor design including: the number of winding 216 turns of the stator 210; the magnet field strength of the rotor 204; and the permeability of the flux path in the motor 56. Substituting Equation (2) into Equation (1) results in Equation (3).

$$\begin{aligned} e_{ind} &= -\frac{d\lambda}{dt} \\ &= -\frac{d(K_v \sin(\omega t))}{dt} \\ &= -K_v \omega \cos(\omega t) \end{aligned} \quad (3)$$

Equation (3) demonstrates that the magnitude of the voltage included on a phase of a winding 216 of the stator 210 is proportional to the voltage constant $K_v$ and the rotational speed of the motor 56.

Equation (4) illustrates that the voltage constant $K_v$ is a function of the number of turns of the windings 216, the permeability of the flux path, and the strength of the magnets 208, as shown below.

$$K_v = f(N, \mu, \Phi) \quad (4)$$

where N is the number of turns in the stator windings, $\mu$ is the permeability of the flux path, and $\Phi$ is the field strength of the rotor magnets.

Thus, Equation (3) for the induced voltage can be written as Equation (5), as shown below.

$$e_{ind} = -f(N, \mu, \Phi)\omega \cos(\omega t) \quad (5)$$

As shown in Equation (5), the magnitude of the induced voltage is the product of the angular velocity of the rotor 204 and a function of the number of turns of the windings 216, the permeability of the steel of the stator 210, and the strength of the magnets 208. If any of these parameters do not match the design criteria, the induced voltage on the motor 56 for a given speed will not match the values calculated based on the design values.

Figure 3:
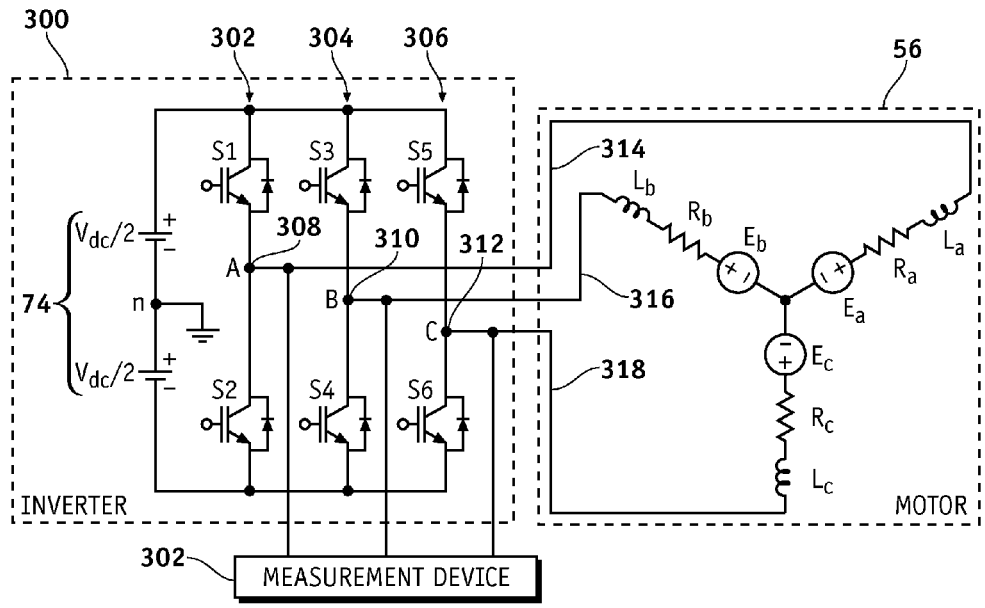
FIG. 3 is a schematic representation of an evaluation system for the electric motor of FIG. 2 in accordance with an exemplary embodiment.

Referring to FIG. 3, the motor 56 includes, or can be coupled to, an inverter 300 to facilitate power flow to and from the motor 300. In one exemplary embodiment, a measurement device 302 measures voltages at the inverter 300. As described below, under certain conditions, the voltages measured at the inverter 300 correspond to the voltages induced on the windings 216 of the stator 210 of the motor 56. As such, the voltages measured at the inverter 300 can used in an evaluation of the motor 56.

The inverter 300 is a three phase circuit coupled to the motor (depicted as the first motor 56, although it could also be the second motor 72). The inverter 300 includes three pairs of series switches 302, 304, and 306 coupled to the battery 74 and the motor 56. The first pair of switches 302 is coupled to the first phase 314 of the motor 56 at a first terminal 308. The second pair of switches 304 is coupled to the second phase 316 of the motor 56 at the second terminal 310. The third pair of switches 306 is coupled to the third phase 318 of the motor 56 at the third terminal 312.

During operation, the inverter 300 creates a three phase voltage on terminals 308, 310, and 312 by changing the states of the three pairs of switches 302, 304, and 306. As an example, the voltage at the inverter 300 (assuming current flowing out of inverter as positive) between two phases (A and B) is illustrated by Equation (6).

$$Vab = La\frac{dIa}{dt} + RaIa + Ea - Eb - RbIb - Lb\frac{dIb}{dt} \quad (6)$$

Typically, the inverter 300 actuates the switches 302, 304, and 306 to control the current that flows in and out of each terminal 308, 310, and 312. If, as stated above, the inverter 300 is commanded to control zero current in the phase terminals using, for example, closed loop current regulators, when $Ia=Ib=dIa/dt=dIb/dt=0$, and the inverter voltage equation reduces to Equation (7).

$$Vab=Ea-Eb \quad (7)$$

Since the currents are assumed zero, the induced voltage from Equation (3), can be equated with the terminal voltage given in Equation (7) to result in Equation (8).

$$Vab=-K_v\omega \cos(\omega t) \quad (8)$$

The relationship between quantities measured in the physical reference frame and a mathematical dq frame is illustrated in Equation (9).

$$\begin{bmatrix} f_d \\ f_q \end{bmatrix} = \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} f_a \\ f_b \\ f_c \end{bmatrix} \quad (9)$$

where f can replaced with appropriate physical quantity, e.g., voltage, current, or flux.

Based on the transformation above in Equation (9), current regulators that control the switches 302, 304, and 306 can be expressed in the form of Equations (10).

$$Vd=PI_{regulator}(I_{d\,commanded}-I_{d\,measured})$$

$$Vq=PI_{regulator}(I_{q\,commanded}-I_{q\,measured}) \quad (10)$$

The current regulators work on the measured current, as compared to the commanded current. As noted above, the commanded currents are designated as zero by the inverter 300. Therefore, all of the non-zero terms on the right side of Equation (10) are measurable and the voltage that is needed to keep the currents zero is calculated as the current regulators drive the measured current to the desired current. The magnitude of the developed voltage can be calculated as shown in Equation (11).

$$V\text{ref}=\sqrt{V_d^2+V_q^2} \quad (11)$$

The voltage should be measured below base speed, i.e., when the inverter output voltage is maximum. In other words, the base speed is the point at which the induced voltage on the motor 56 or 72 matches the supply voltage available to the inverter 300. Comparing Vref of Equation (11) to Equation (8), and knowing the motor speed from measurement, the voltage constant Kv of the either of the motors 56 and 72 can be calculated and compared against a set of accepted values to thus evaluate the motor 56 or 72.

Now that the transmission 10, motors 56 and 72, and inverter 300 have been described, conditions and methods for evaluating the motors 56 and 62 utilizing the inverter 300 will now be discussed. Referring again to FIG. 1, in one embodiment of the present invention, a method is provided for evaluating the first and second motors 56 and 72 of the transmission 10 at the end of a manufacturing line, for example, at the manufacturer or OEM. The conditions for the exemplary method will first be described.

In this embodiment of the method, the transmission 10 is attached at the input member 12 to an input dynamometer machine 82 and at the output member 64 to an output dynamometer machine 84. The input and output machines 82 and 84 can spin the input and output members 10 and 64, respectively, of the transmission 10 at prescribed speeds and/or torques.

In various embodiments, any of the modes and/or gear configurations of the transmission 10 can be used for the end of line transmission evaluation. In one embodiment, the first mode is utilized to simulate the first fixed gear, in which the first clutch 70 and the fourth clutch 75 are closed and the second clutch 62 and the third clutch 73 are open. In the first fixed gear, the speed of the input dynamometer 82, the first motor 56, and the second motor 72 are equal, and the speed of the output dynamometer 84 is the different by the ratio of the first gear set 24. The first mode simulates the first fixed gear by selecting an input speed and an output speed such that the input speed is equal to the output speed times the first gear ratio. This will result in the slip speed of the fourth clutch 62 to be zero without the clutch actually being engaged.

The first mode is used to simulate the first fixed gear because, if the input dynamometer 82 and the output dynamometer 84 are both controlling speed while connected by a fixed gear, the two dynamometers 82 and 84 will oppose each other.

In this embodiment, it may also be advantageous to open the contactors to the inverter 300 (FIG. 3) connected to the transmission 10 or disconnect the phase windings 216 (FIG. 2) from the inverter 300 to prevent rectification in the inverter 300 from allowing current to flow during the test. Alternatively, DC voltage of the inverter 300 (FIG. 3) is greater than the max peak expected generated voltage from the motor 56 or 72 to avoid rectification current.

Figure 4:
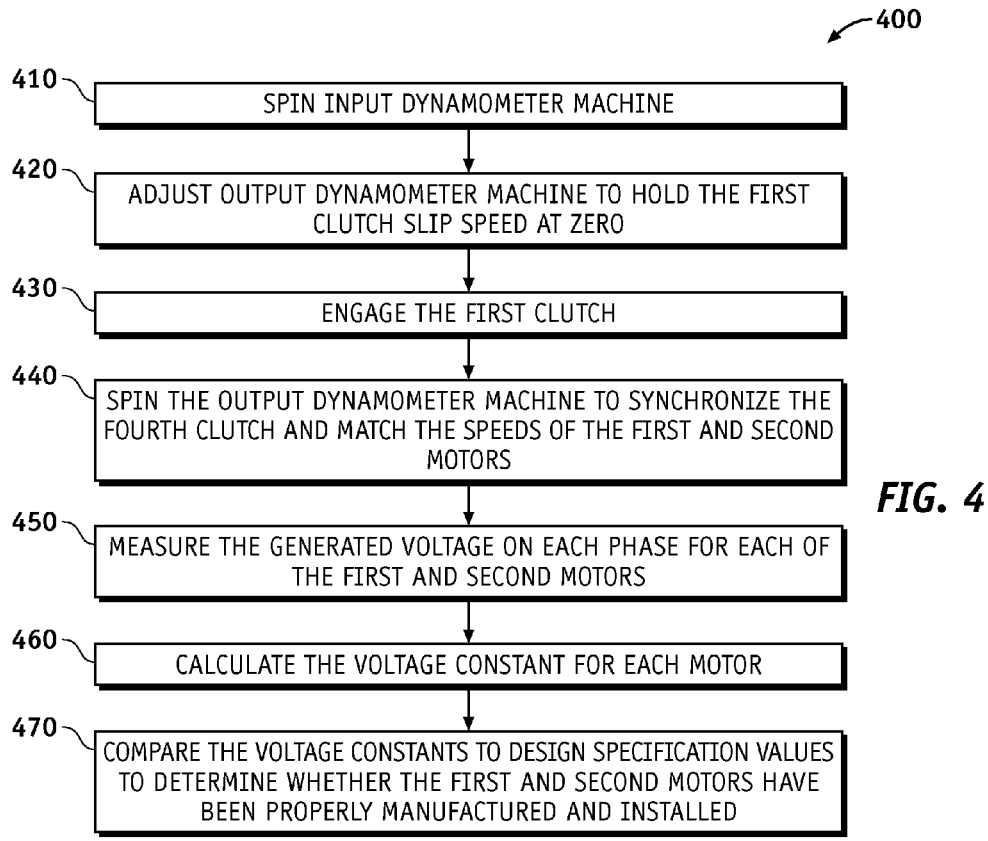
FIG. 4 illustrates an exemplary method for evaluating a motor at an end-of-line manufacturing test.

Now that the conditions for an end-of-line manufacturing evaluation have been described, the steps of an exemplary method 400 for evaluating the motors after manufacturing will now be discussed. Referring to FIG. 4, in a first step 410 of the method 400, the input dynamometer machine 82 is spun to an acceptable speed for the test. In an exemplary embodiment, the acceptable speed can be, for example, about 2000 rpm. Generally, the speed of the input dynamometer machine 82 should be just below the flux weakening speed, or the base speed of the motor 56 or 72 as determined from the design parameters. Moreover, generally, the speed should be such that the generated voltage is less than the inverter DC voltage, and sufficient for a main pump in the transmission 10 to provide sufficient hydraulic pressure to enable engagement of the first clutch 70.

In a second step 420, the output dynamometer machine 84 is adjusted to hold the first clutch 70 slip speed to zero. When the input dynamometer 82 is spinning, motor 56 or motor 72 spins though the planetary gear sets 24 and 26. When the motor 72 spins, there is only one output speed that will hold the ring gear 46 of the third planetary gear 28 at zero speed. Since one side of the first clutch 70 is connected to the transmission case 68 to achieve zero slip speed across the clutch 70, i.e., both sides of the clutch 70 spin at the same speed, the ring 48 of the gear 28 should be kept at zero speed.

In a third step 430, the first clutch 70 is engaged, and in a fourth step 440 the output dynamometer machine 84 is spun at the appropriate speed to synchronize the fourth clutch 75 and match the speeds of the first and second motors 56 and 72. As a result of this spinning, a voltage is induced on the windings of each motor 56 and 72, which as noted above, is represented by Equation (5). In a fifth step 450, the generated voltage on each phase for each of the first and second motors 56 and 72 is measured with the measurement device 302 (FIG. 3). In a sixth step 460, the magnitude of the measured voltage of each motor 56 and 72 is divided by the rotational speed of each motor 56 and 72 to result in the voltage constant for each motor 56 and 72. In a seventh step 470, the voltage constants of the first and second motors 56 and 72 can be compared with design specification values to determine whether the first and second motors 56 and 72 have been proper manufactured and installed. If the voltage constants are outside an acceptable tolerance range, it can be deduced that the tested motor 56 and 72 does not meet the design criteria and should not be used.

In accordance with another exemplary embodiment, a method is provided for evaluating the transmission 10 in a service environment. During service, the input and output dynamometer machines 82 and 84 may not be available, and thus, the end of line transmission test may not be feasible. However, due to the gearing configuration of the transmission 10, an exemplary embodiment of a method can be provided to evaluate the motors 56 and 72 in a service environment.

A consistent relationship exists between the input speed from the input member 12 and the speeds of the first and second motors 56 and 72, as shown in Equation (12) below:

$$Ni = K_1 Na + K_2 Nb \tag{12}$$

In a neutral condition, torque equations relating the input torque of the input member 12 and the torques for the first and second motors 56 and 72 are shown in Equation (13) below:

$$\begin{bmatrix} Tb \\ Ti \end{bmatrix} = \begin{bmatrix} K_{T1} \\ -K_{T2} \end{bmatrix} Ta \tag{13}$$

Equation (13) can be solved for the torque of the first motor 56 (Ta) and the torque from the input member 12 (Ti) as a function of the torque on the second motor 72 (Tb), as show below in Equation (14).

$$\begin{bmatrix} Ta \\ Ti \end{bmatrix} = \begin{bmatrix} K_{T3} \\ -K_{T4} \end{bmatrix} Tb \tag{14}$$

As such, commanding speed control to the first motor 56 results in a torque command to the first motor 56 with a magnitude necessary to maintain the desired speed. Since, under this test environment, there will be no load on the first motor 56, the torque required to maintain the desired speed will be as low as the torque required will be overcome friction in the transmission 10, i.e., the "breakaway torque." Since the breakaway torque of the engine 14 will be significantly larger than the breakaway torque on the transmission 10, the torque generated at the transmission input 12 will not be enough to spin the engine 14.

Accordingly, if the speed of the engine 14 is kept at zero, and the engine 14 is not loaded with more than a breakaway torque, Equation (14) results in Equation (15) as shown below.

$$0 = K_1 Na + K_2 Nb \tag{15}$$

Equation (15) can be solved, as shown below in Equation (16).

$$Na = -\frac{K_2}{K_1} Nb \tag{16}$$

Due to the gear coefficients of the transmission 10, Equation (16) can be rewritten as Equation (17), as shown below.

$$Na \approx -Nb \tag{17}$$

Equation (17) indicates that the first motor 56 spins unloaded in the opposite direction and at the same speed as the second motor 72, or at least has a linear relationship. Accordingly, the first motor 56 can be used to spin the second motor 72, and the phase voltages of the second motor 72 can then be measured to determine the associated voltage constant. Similarly, the second motor 72 can be used to spin the first motor 56, and the phase voltages of the first motor 56 can be measured to determine the associated voltage constant.

Figure 5:
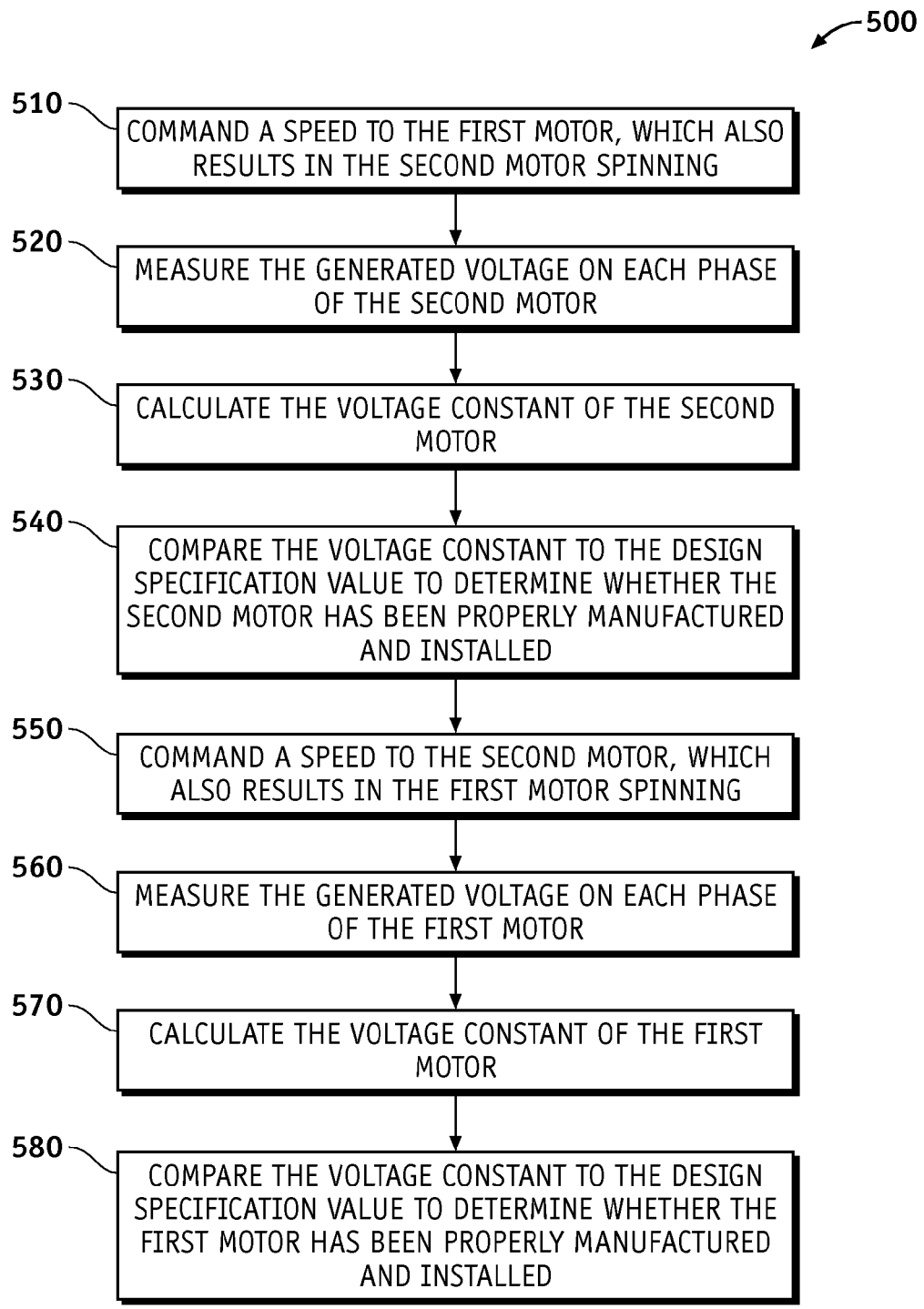
FIG. 5 illustrates an exemplary method for evaluating a motor during service.

Referring to FIG. 5, in a first step 510 of the method 500, a device control message from the ECU 76 is utilized to command a speed to the first motor 56. As noted above, this also results in the second motor 72 spinning in opposite direction but at the same speed.

In a second step 520, the generated voltage on each phase of the second motor 72 is measured. The voltage is measured at the inverter 302 coupled to the second motor 72 (FIG. 3).

In a third step 530, the magnitude of the measured voltage is divided by the rotational speed of the second motor 72 to result in the voltage constant of the second motor 72.

In a fourth step 540, the voltage constant of the second motor 72 is compared to the design specification value. The above-described steps are then repeated except the second motor 72 is controlled to a speed that spins the first motor 56 such that the first motor 56 can be similarly evaluated. As such, in a fifth step 550, a speed is command to the second motor 72, which results in the first motor 56 spinning. As such, in a sixth step 560, the generated voltage on each phase of the first motor 56 is measured.

In a seventh step 570, the magnitude of the measured voltage is divided by the rotational speed of the first motor 56 to result in the voltage constant.

In an eighth step 580, the voltage constant of the first motor 56 is compared to the predetermined values in the design specification to evaluate the first motor 56. If the voltage constants derived from the voltage measurements of the first and second motors 56, 72 are within an acceptable threshold of the predetermined values, then the motors 56, 72 are deemed to be properly manufactured, installed, and maintained. Conversely, if the voltage constants are outside of the threshold, it may indicate an issue with the motors 56, 72.

Accordingly, exemplary methods evaluating first and second motors in a two-mode, compound-split, electro-mechanical transmission have been provided. In particular exemplary embodiments, the motors can be evaluated at an end-of-line transmission test and during service.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for evaluating a motor assembly comprising a first permanent magnet motor in a transmission of an automotive drive system at an end of manufacturing line evaluation, the first motor comprising a first rotor with a first plurality of magnets mounted thereon, and a first stator with a first plurality of windings in proximity to the first rotor, wherein the first windings are coupled to a first inverter, the method comprising:
    spinning the first motor with an input dynamometer machine to a predetermined speed such that the first rotor of the first motor induces a first voltage on the first inverter;
    measuring the first voltage on the first inverter;
    calculating a first voltage constant of the first motor from the first voltage;
    comparing the first voltage constant to a set of accepted voltage constants; and
    identifying the motor as not acceptable if the first voltage constant is outside of a range of the set of accepted voltage constants.

2. The method of claim 1, wherein the motor assembly further comprises a second motor, the second motor a second rotor with a second plurality of magnets mounted thereon, and a second stator with a second plurality of windings in proximity to the rotor, wherein the second windings are coupled to a second inverter, the method further comprising:
    spinning the second motor with an output dynamometer machine to match the predetermined speed of the first motor such that the second rotor induces a second voltage on the second inverter;
    measuring the second voltage on the second inverters;
    calculating second voltage constants of the second motors from the second voltage;
    comparing the second voltage constants to a set of accepted voltage constants; and
    identifying the motor as not acceptable if the second voltage constant is outside of a range of the set of accepted voltage constants.

3. The method of claim 1, further comprising, prior to the spinning step, placing the transmission in a simulated first fixed gear.

4. The method of claim 1, further comprising, prior to the spinning step, placing the transmission in a first mode.

5. The method of claim 1, further comprising, prior to the spinning step, placing the transmission in a condition such that a speed of the input dynamometer approximately equals the speed of the first motor.

6. The method of claim 5 wherein the transmission further comprises a second motor with a second rotor having a second plurality of magnets mounted thereon, and a second stator with a second plurality of windings in proximity to the rotor, wherein the second windings are coupled to a second inverter, the method further comprising:
    spinning the second motor with an output dynamometer machine to match the predetermined speed of the first motor such that the second rotor induces a second voltage on the second inverter;
    measuring the second voltages on the second inverters;
    calculating second voltage constants of the second motors from the second voltages; and
    comparing the second voltage constants to a set of accepted voltage constants.

7. The method of claim 6, further comprising adjusting the output dynamometer machine to hold a slip speed of the first clutch at zero.

8. The method of claim 6, wherein the first voltage measuring step includes measuring the voltages on three phases of the first motor.

9. The method of claim 6, wherein the second voltage measuring step includes measuring the voltages on three phases of the second motor.

10. A method for evaluating permanent magnet motors in a transmission of an automotive drive system in a service environment, the motors comprising first and second motors, each including a rotor with a plurality of magnets mounted thereon, and a stator with a plurality of windings in proximity to the rotor, wherein the windings of the first and second motor are respectively coupled to first and second inverters, the method comprising:
    spinning the first motor to a predetermined speed to spin the second motor such that the rotor of the second motor induces a voltage on the second inverter;
    measuring the voltage on the second inverter;
    calculating a voltage constant of the second motor from the voltage; and
    comparing the voltage constant of the second motor to a set of accepted voltage constants.

11. The method of claim 10, further comprising
    spinning the second motor to a predetermined speed to spin the first motor such that the rotor of the first motor induces a second voltage on the first inverter;
    measuring the second voltage on the first inverter;
    calculating a voltage constant of the first motor from the second voltage; and
    comparing the voltage constant of the first motor to a set of accepted voltage constants.

12. The method of claim 10, wherein the first and second motors are coupled together within a transmission, and wherein the method further comprises placing the transmission in neutral.

13. The method of claim 10, wherein the first and second motors are coupled together within a transmission having an engine, and wherein the method further comprises turning the engine off.

14. The method of claim 10, wherein the spinning step includes spinning the first motor such that the second motor spins unloaded in an opposite direction to the first motor.

15. An automotive drive system, comprising:
    an internal combustion engine;

a two-mode, compound-split, electro-mechanical transmission coupled to the internal combustion engine, the transmission comprising:

an input member to receive power from the internal combustion engine;

an output member to deliver power from the transmission;

the first motor and a second motor that are coaxially aligned;

first, second, and third coaxially aligned planetary gear arrangements, each planetary gear arrangement utilizing first, second and third gear members, the first and second motors being coaxially aligned with the three planetary gear arrangements, at least one of the first, second, and third gear members in the first or second planetary gear arrangement being connected to the first motor, and another one of the first, second, and third gear members in the second and third planetary gear arrangements being connected to the second motor, one of the gear members of the first planetary gear arrangement being continuously connected to the input member;

a first clutch to selectively connect one of the gear members of the third planetary gear set with ground;

a second clutch to selectively connect one of the gear members associated with each of the planetary gear arrangements to each other and to the output member;

a third clutch to selectively connect one of the gear members of the second planetary gear set with another of the gear members of the second planetary gear set;

a fourth clutch to selectively connect one of the gear members of the second planetary gear set with ground;

a first interconnecting member continuously connecting one of the members of the first planetary gear set with one of the members of the second planetary gear set; and a second interconnecting member continuously connecting one of the members of the second planetary gear set with one of the members of the third planetary gear set;

a power inverter coupled to the first and second motors; and a processor configured to:

measure a first voltage induced by the first motor at the power inverter when the first motor is spun to a predetermined speed;

calculate a first voltage constant from the first voltage;

compare the first voltage constant to a set of accepted voltage constants;

measure a second voltage induced by the second motor at the second inverter when the second motor is spun to the predetermined speed;

calculate a second voltage constant of the second motor from the second voltage; and compare the second voltage constant to a set of accepted voltage constants.

16. The system of claim 15, wherein the first motor is configured to be spun by an input dynamometer and the second motor is configured to be spun by an output dynamometer.

17. The system of claim 15, wherein the second motor is configured to be spun by the first motor.

18. The system of claim 15, wherein the processor is configured to measure first voltages on three phases of the first motor.

19. The system of claim 15, wherein the processor is configured to measure second voltages on three phases of the second motor.

20. The system of claim 15, wherein the processor is configured to produce a service signal when the first or second voltage constants are not within a range of accepted voltage constants.

* * * * *